(12) United States Patent
Hsu et al.

(10) Patent No.: US 9,159,773 B2
(45) Date of Patent: Oct. 13, 2015

(54) THIN FILM TRANSISTOR AND ACTIVE MATRIX ORGANIC LIGHT EMITTING DIODE ASSEMBLY

(71) Applicant: EverDisplay Optronics (Shanghai) Limited, Shanghai (CN)

(72) Inventors: Chia-che Hsu, Shanghai (CN); Chia-chi Huang, Shanghai (CN); Wei-ting Chen, Shanghai (CN); Min-ching Hsu, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/298,479

(22) Filed: Jun. 6, 2014

(65) Prior Publication Data
US 2014/0374714 A1    Dec. 25, 2014

(30) Foreign Application Priority Data
Jun. 21, 2013   (CN) .......................... 2013 1 0251969

(51) Int. Cl.
*H01L 29/78*   (2006.01)
*H01L 27/32*   (2006.01)
*H01L 29/66*   (2006.01)
*H01L 29/786*  (2006.01)
*H01L 27/12*   (2006.01)

(52) U.S. Cl.
CPC .......... *H01L 27/3244* (2013.01); *H01L 27/127* (2013.01); *H01L 29/66757* (2013.01); *H01L 29/78621* (2013.01); *H01L 27/3262* (2013.01); *H01L 2029/7863* (2013.01)

(58) Field of Classification Search
USPC .......................................... 257/40
See application file for complete search history.

(56) References Cited

U.S. PATENT DOCUMENTS

| | | | |
|---|---|---|---|
| 6,271,543 B1 * | 8/2001 | Ohtani et al. | 257/72 |
| 2002/0098635 A1 * | 7/2002 | Zhang et al. | 438/199 |
| 2002/0104992 A1 * | 8/2002 | Tanabe et al. | 257/48 |
| 2007/0257250 A1 * | 11/2007 | Tseng et al. | 257/40 |
| 2014/0374718 A1 * | 12/2014 | Hsu et al. | 257/40 |

* cited by examiner

*Primary Examiner* — Thao P Le
(74) *Attorney, Agent, or Firm* — Yunling Ren; Eaton & Van Winkle

(57) ABSTRACT

A thin film transistor includes a semiconductor layer including a source region, a drain region, a channel region, first lightly doped drain regions adjacent to the channel region and second lightly doped drain regions adjacent to the first lightly doped drain regions; wherein the second lightly doped drain regions have a doping concentration lower than that of the first lightly doped drain regions. According to the present application, the leakage current in a switching transistor may be further reduced, thereby avoiding instability and even failure in the operation of the assembly caused by overlarge leakage current.

6 Claims, 15 Drawing Sheets

THIN FILM TRANSISTOR AND ACTIVE MATRIX ORGANIC LIGHT EMITTING DIODE ASSEMBLY

CROSS REFERENCE TO RELATED APPLICATIONS

The present application claims priority under 35 U.S.C. §119 to Chinese Patent Application No. 201310251969.1, filed on Jun. 21, 2013, the entire contents of which are incorporated herein by reference.

TECHNICAL FIELD

The present disclosure relates to an active matrix organic light emitting display, and in particular to a Thin Film Transistor (TFT), an Active Matrix Organic Light Emitting Diode (AMOLED) assembly including the TFT and a method for manufacturing the TFT.

BACKGROUND

As a new generation of display technology, AMOLED has advantages such as self-illumination, wide viewing angle, high contrast ratio, low power consumption, high response speed, high resolution, full color, and thinness. Thus, AMOLED is expected to be one of mainstream display technologies in future.

Low Temperature Poly-Silicon (LTPS) process is usually employed in TFT array assembly portion of the AMOLED. Qualities of the TFTs and the array assembly including the TFTs will decide final display quality of the AMOLED.

A TFT applied in an AMOLED or other electronic assembly usually has a Lightly Doped Drain (LDD) region. The LDD region may reduce short channel effect and hot carrier effect. Furthermore, a phenomenon of the assembly failure and collapse and a large leakage current will not occur when the assembly is operating under a relatively high voltage. However, in a high resolution display assembly for example, as the reduction in size of the TFT, influence of the leakage current still needs to be avoided.

The above information disclosed in the background portion is only for purpose of enhancing understanding of the background of the present disclosure, and thus it may include information which does not constitute prior art known to one of ordinary skill in this art.

SUMMARY OF THE INVENTION

The present application discloses a TFT, an AMOLED assembly including the TFT and a method for manufacturing the same, which may further reduce Ioff (off current).

Other properties and advantages of the present disclosure will become clear through the following detailed description, or may be learned partially by the practice of the present disclosure.

According to an aspect of the present disclosure, a TFT is provided, which includes: a semiconductor layer having a source region, a drain region, a channel region, first lightly doped drain regions adjacent to the channel region and second lightly doped drain regions adjacent to the first lightly doped drain regions; wherein one of the second lightly doped drain regions is adjacent to the source region, and the other of the second lightly doped drain regions is adjacent to the drain region; and the second lightly doped drain regions have a doping concentration lower than that of the first lightly doped drain regions.

The TFT may further include: a substrate; a buffer layer on the substrate, the semiconductor layer being on the buffer layer; a first gate insulating layer covering the semiconductor layer; a second gate insulating layer foot on the first gate insulating layer, the second gate insulating layer foot having a width smaller than that of the first gate insulating layer; and a gate electrode on the second gate insulating layer foot.

The first gate insulating layer may be a silicon oxide layer.

The second gate insulating layer foot may include silicon nitride.

The semiconductor layer may include low temperature poly-silicon.

The gate electrode may be formed of at least one material selected from a group consisting of molybdenum, aluminum, an alloy of aluminum and nickel, an alloy of molybdenum and tungsten, chromium, and copper.

An edge of the second gate insulating layer foot may have a protrusion, such that a thickness of the edge is larger than a thickness of other part of the second gate insulating layer foot.

A width of the gate electrode may be smaller than a width of the second gate insulating layer foot.

According to another aspect of the present disclosure, a method for manufacturing a TFT is provided, which includes: forming a structure which includes a substrate, a semiconductor layer on the substrate, a first gate insulating layer covering the semiconductor layer, a second gate insulating layer foot on the first gate insulating layer and a gate electrode on the second gate insulating layer foot, wherein an edge of the second gate insulating layer foot has a protrusion, such that a thickness of the edge of the second gate insulating layer foot is larger than a thickness of other part of the second gate insulating layer foot; and using the gate electrode and a second gate insulating layer as masks, injecting impurity ions into the semiconductor layer so as to form a source region, a drain region, second lightly doped drain regions adjacent to the source region/drain region and first lightly doped drain regions adjacent to the second lightly doped drain regions, wherein one of the second lightly doped drain regions is adjacent to the source region, and the other of the second lightly doped drain regions is adjacent to the drain region; and the second lightly doped drain regions have a doping concentration lower than that of the first lightly doped drain regions.

The second gate insulating layer foot may be formed by the following steps: forming a first photoresist layer covering the first gate insulating layer and performing patterning so as to form a first photoresist pattern, the first photoresist pattern comprising an opening exposing a middle part of the semiconductor layer; forming a second gate insulating layer on the first photoresist pattern, the second gate insulating layer covering an upper surface of the first photoresist pattern, sidewall surfaces within the opening and exposed surface of the semiconductor layer; depositing a gate metal layer on the second gate insulating layer, the gate metal layer not completely filling the opening; applying a second photoresist layer on the gate metal layer and baking the second photoresist layer; removing a part of the second photoresist layer so as to leave a second photoresist pattern in the opening, a top surface of the second photoresist pattern being lower than a top surface of the gate metal layer; using the second photoresist pattern as a mask, selectively removing a part of the gate metal layer by wet etching so as to form a gate metal pattern; and using the second photoresist pattern and the gate metal pattern as masks, selectively removing a part of the second gate insulating layer by wet etching so as to form the second gate insulating layer foot.

After forming the second gate insulating layer foot, the method may further include: using the second photoresist pattern as a mask, performing a secondary etching on the gate metal pattern by wet etching so as to form a gate electrode.

The second photoresist layer may completely fill the opening and cover a top portion of the gate metal layer.

An exposed upper surface of the gate metal pattern may be flush with an upper surface of the gate metal pattern below the second photoresist pattern.

According to a further aspect of the present disclosure, an AMOLED assembly is provided, which includes any one TFT mentioned previously.

According to technical solutions of the present disclosure, series LDDs may be formed in an active layer. The series LDDs may further reduce Ioff (off current) of a TFT.

BRIEF DESCRIPTION OF THE DRAWINGS

By the detailed description of exemplary implementations with reference to the drawings, the above and other features and advantages of the present disclosure will become more obvious.

DETAILED DESCRIPTION OF THE EMBODIMENTS

Figure 1:
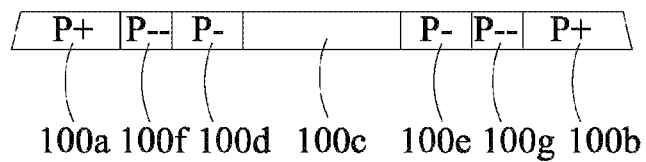
FIG. 1 is a sectional view illustratively showing a structure schematic diagram of a semiconductor layer of a TFT according to an exemplary implementation of the present disclosure.

Now, exemplary implementations will be described more comprehensively with reference to the drawings. However, the exemplary implementations may be carried out in various manners, and shall not be interpreted as being limited to the implementations set forth herein; instead, providing these implementations will make the present disclosure more comprehensive and complete and will fully convey the conception of the exemplary implementations to one of ordinary skill in this art. In the drawings, thicknesses of regions and layers are exaggerated for the sake of clarity. Throughout the drawings similar reference signs indicate the same or similar structures, and their detailed description will be omitted.

In addition, the features, structures or characteristics described herein may be combined in one or more embodiments in any suitable manner. In the following description, many specific details are provided to facilitate sufficient understanding of the embodiments of the present disclosure. However, one of ordinary skill in this art will appreciate that the technical solutions in the present disclosure may be practiced without one or more of the specific details, or other methods, elements, materials and so on may be employed. In other conditions, well-known structures, materials or operations are not shown or described in detail to avoid confusion of respective aspects of the present disclosure.

FIG. 1 is a sectional view illustratively showing a schematic structure of a semiconductor layer of a TFT according to an exemplary implementation of the present disclosure.

Referring to FIG. 1, a semiconductor layer of a TFT according to an exemplary implementation of the present disclosure includes a source region and a drain region 100a and 100b, a channel region 100c, first LDD regions 100d and 100e, and second LDD regions 100f and 100g.

The first LDD regions 100d and 100e are adjacent to the channel region 100c. The second LDD regions 100f and 100g are adjacent to the first LDD regions 100d and 100e, respectively. The second LDD regions 100f and 100g have a doping concentration lower than that of the first LDD regions 100d and 100e. The second LDD regions 100f and 100g are adjacent to the first LDD regions 100d and 100e so as to form series LDD regions.

Since the second LDD regions 100f and 100g have a lower doping concentration, the second LDD regions 100f and 100g have a higher impedance. The series LDD regions may further suppress the leakage current of the assembly. By employing the AMOLED assembly including the TFT according to implementations of the present disclosure, better electrical conditions may be obtained to achieve a better display quality.

Figure 2:
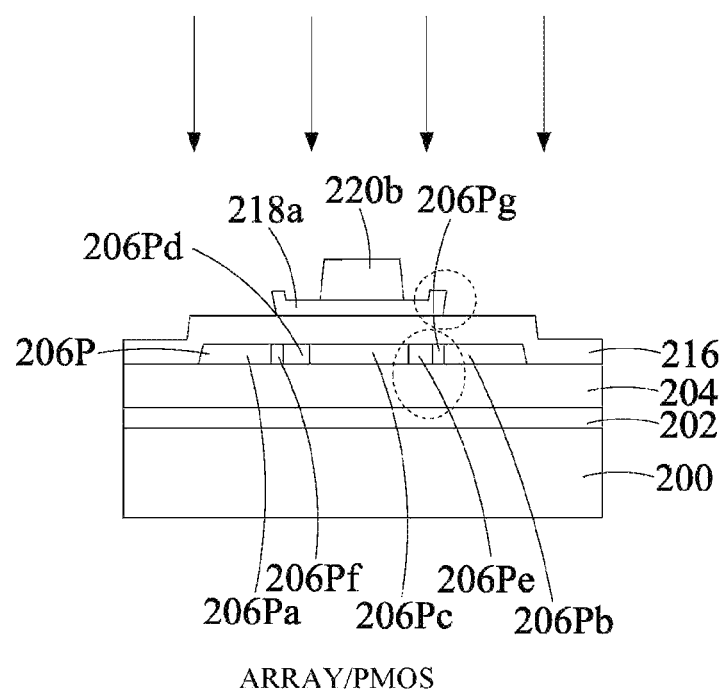
FIG. 2 is a sectional view illustratively showing a schematic diagram of a structure and a forming method of a TFT according to an exemplary implementation of the present disclosure.

FIG. 2 is a sectional view illustratively showing a schematic diagram of a structure and a forming method of a TFT according to an exemplary implementation of the present disclosure.

Referring to FIG. 2, a structure which includes a substrate 200, buffer layers 202 and 204 on the substrate 200, a semiconductor layer 206P on the buffer layers, a first gate insulating layer 216 covering the semiconductor layer 206P, a second gate insulating layer foot 218a on the first gate insulating layer 216 and a gate electrode 220b on the second gate insulating layer foot 218a is formed. The semiconductor layer may include a LTPS layer. A width of the second gate insulating layer foot 218a is smaller than a width of the first gate insulating layer 216. The first gate insulating layer 216 may be a silicon oxide layer, for example. The second gate insulating layer foot 218a may be silicon nitride, for example. An edge of the second gate insulating layer foot may have a protrusion, such that a thickness of the edge of the second gate insulating layer foot is larger than a thickness of the other part of the second gate insulating layer foot. A width of the gate electrode 220b is smaller than a width of the second gate insulating layer foot 218a.

Using a gate structure including the gate electrode 220b and the silicon nitride foot 218a as a mask, impurity ions are injected into the semiconductor layer so as to form a source region and a drain region 206Pa and 206Pb. Because of the structure of the silicon nitride foot, first LDD regions 206Pd and 206Pe and second LDD regions 206Pf and 206Pg (the second LDD regions 206Pf and 206Pg having a doping concentration lower than that of the first LDD regions 206Pd and 206Pe) may be formed in a self-alignment manner. The first LDD regions 206Pd and 206Pe are adjacent to the second LDD regions 206Pf and 206Pg so as to form series LDD regions. A semiconductor region below the gate electrode 220b is a channel region. In this way, a TFT having series LDD regions may be obtained. The series LDDs may further reduce Ioff (off current) of a TFT. After this, other subsequent processes well known to one of ordinary skill in this art may be performed, and detailed descriptions thereof will be omitted.

FIGS. 3, 4, 5, 6, 7, 8, 9, 10, 11, 12, 13, 14 and 15 illustratively show schematic diagrams of respective stages of a method for manufacturing an AMOLED array substrate according to an exemplary implementation of the present disclosure. By the shown manufacturing method, a PMOS TFT and/or a NMOS TFT used for an AMOLED array substrate and having series LDDs according to an exemplary implementation of the present disclosure may be manufactured on a substrate. However, the present disclosure is not limited thereto, the method according to the present disclosure may also be used for manufacturing a TFT of other assemblies.

Figure 3:
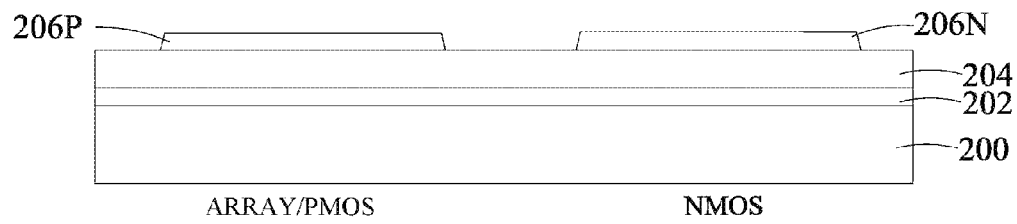
FIGS. 3, 4, 5, 6, 7, 8, 9, 10, 11, 12, 13, 14 and 15 illustratively show schematic diagrams of respective stages of a method for manufacturing an AMOLED array substrate according to an exemplary implementation of the present disclosure.

Referring to FIG. 3, in the method for manufacturing an AMOLED assembly according to a first exemplary implementation of the present disclosure, firstly, a substrate 200 including a buffer layer thereon is prepared. The substrate 200 may be a glass substrate or a flexible substrate, or may be other suitable substrates. The buffer layer may include a silicon nitride layer 202 and a silicon oxide layer 204 on the silicon nitride layer. However, the present disclosure is not limited thereto.

Optionally, an upper surface of the silicon oxide layer may be processed using one of $O_2$, $N_2$, $NH_3$, and $H_2$, so as to reduce the amount of defects such as dangling bond to suppress an interface leakage current.

Then, semiconductor layers 206P and 206N are formed on the substrate. The semiconductor layer may include a LTPS layer.

For example, an amorphous silicon (a-Si) thin film may be formed on the substrate by methods such as Plasma Enhanced Chemical Vapor Deposition (PECVD), and then the amorphous silicon is crystallized by methods such as Excimer Laser Annealing (ELA), and thereby a poly-silicon (Poly-Si) film may be obtained. Then, a photoresist is formed on the substrate, and using photolithography, a photoresist pattern may be obtained by patterning. Using the photoresist pattern as a mask, the poly-silicon film is patterned so as to form a plurality of semiconductor layers 206P and 206N. Then, the photoresist pattern is peeled off.

Figure 4:
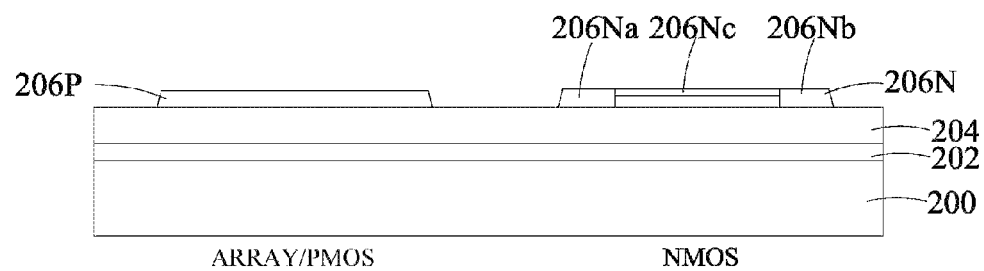

Next, channel surface doping may be performed on the semiconductor layers 206P and 206N so as to adjust a threshold voltage Vth. For example, the channel surface doping may be performed simultaneously on the semiconductor layers 206P and 206N by using $BF_3$. Then, a photoresist is formed on a resulted structure and patterning is performed, exposing regions where a NMOS TFT is to be formed, so as to perform a secondary channel implantation on the semiconductor layer of the NMOS TFT using P type dopant such as $BF_3$. Next, after removing the photoresist pattern, another photoresist pattern is formed on a resulted structure, exposing predetermined regions where a source region/a drain region of the NMOS TFT is to be formed. The predetermined regions where the source region/drain region of the semiconductor layer of the NMOS TFT is to be formed are doped with N type impurities such as P or As so as to form the source region and the drain region. Then, the photoresist pattern is peeled off. The resulted structure is shown in FIG. 4, in which a semiconductor active layer of the NMOS TFT includes a source region 206Na, a drain region 206Nb and a middle part 206Nc between the source region 206Na and the drain region 206Nb.

Figure 5:
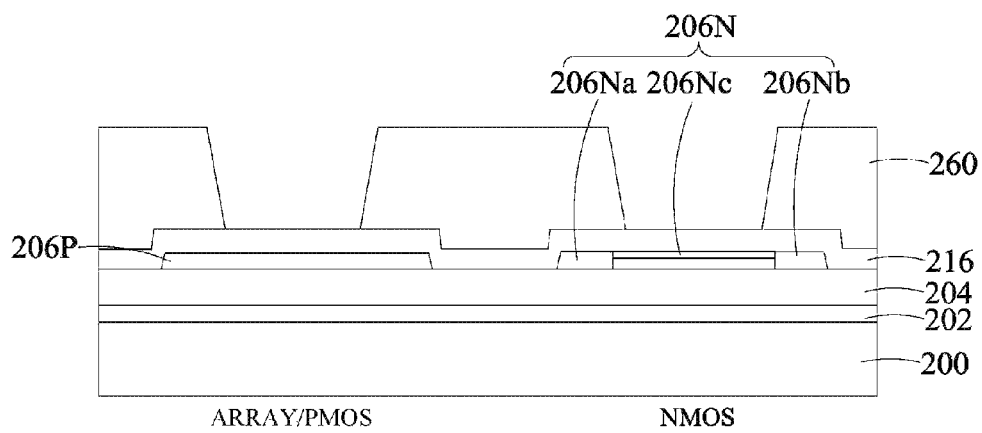

As shown in FIG. 5, a first gate insulating layer 216 covering the semiconductor layers is formed using methods such as Chemical Vapor Deposition (CVD). The first gate insulating layer 216 may be a silicon oxide layer, for example.

Figure 6:
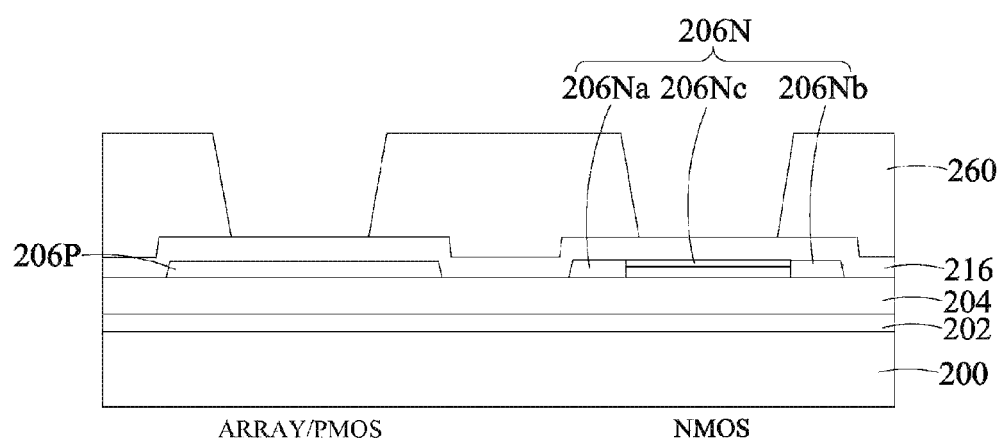

Referring to FIG. 6, a photoresist layer covering the first gate insulating layer 216 is formed and patterning is performed so as to form a photoresist pattern 260. The photoresist pattern 260 has an opening 2602 exposing a middle part between the semiconductor layers 206N and 206P.

Figure 7:
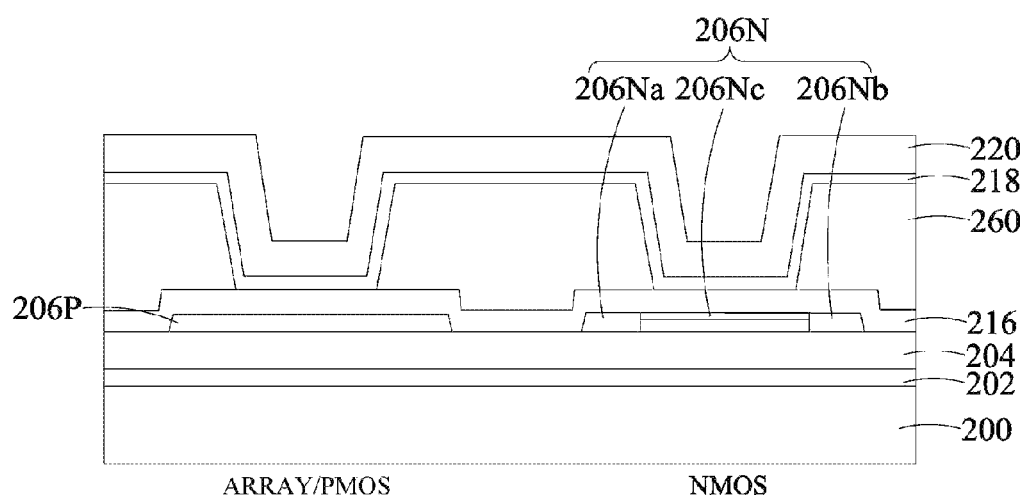

Referring to FIG. 7, a second gate insulating layer 218 is deposited on a resulted structure. The second gate insulating layer 218 may be a silicon nitride material layer, for example. A gate metal layer 220 is deposited on the second gate insulating layer 218. Metal such as molybdenum (Mo), aluminum, an alloy of aluminum and nickel, an alloy of molybdenum and tungsten, chromium, or copper is usually used for the gate metal layer. A combination of thin films of some of the above materials may also be used. In the present exemplary implementation, Mo is used as the gate metal layer 220. The second gate insulating layer 218 and the gate metal layer 220 cover an upper surface of the photoresist pattern 260 and sidewall surfaces within the opening 2602.

Figure 8:
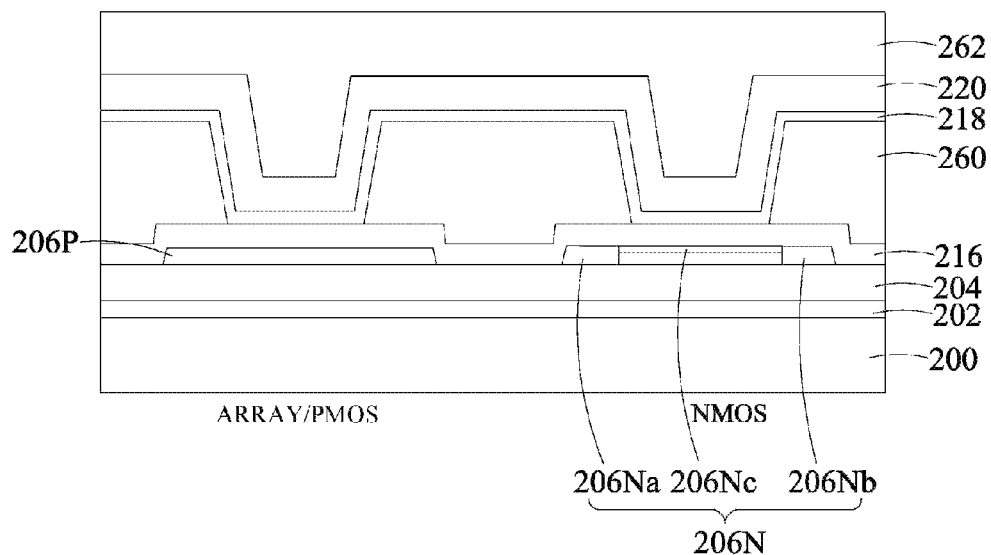

Referring to FIG. 8, a photoresist layer 262 is applied on a resulted structure and is baked. The photoresist layer 262 fills the opening 2602 and covers a top portion of the gate metal layer 220.

Figure 9:
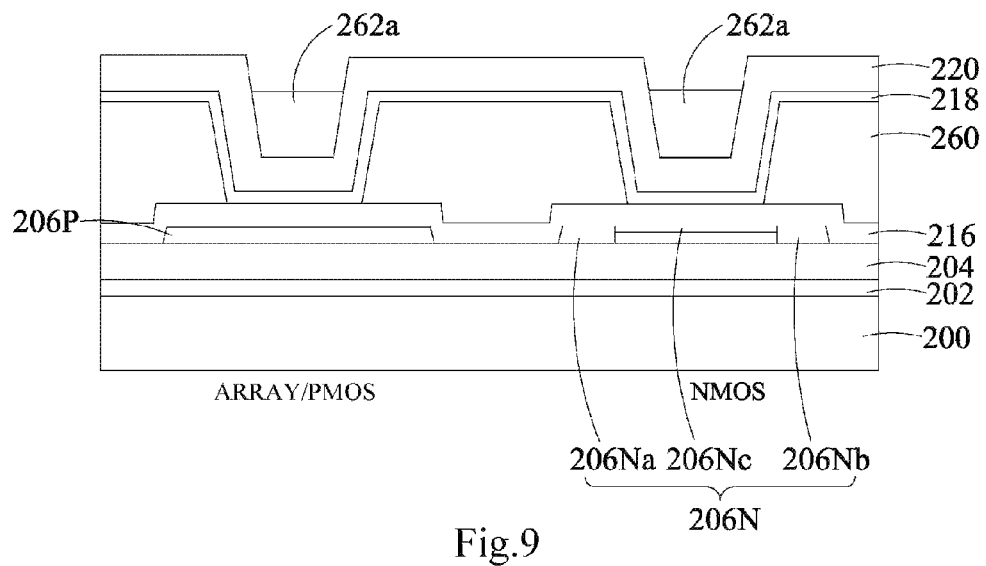

Referring to FIG. 9, a part of the photoresist layer 262 is removed by ashing process, for example, and a photoresist pattern 262a is left in the opening 2602. A top surface of the photoresist pattern 262a needs to be lower than a top surface of the gate metal layer 220. If the top surface of the photoresist pattern 262a is higher than the top surface of the gate metal layer 220, then in the subsequent process for removing a part of the gate metal layer 220 by wet etching, since there exists photoresist on the gate metal layer, the gate metal layer will not be removed by wet etching.

Figure 10:
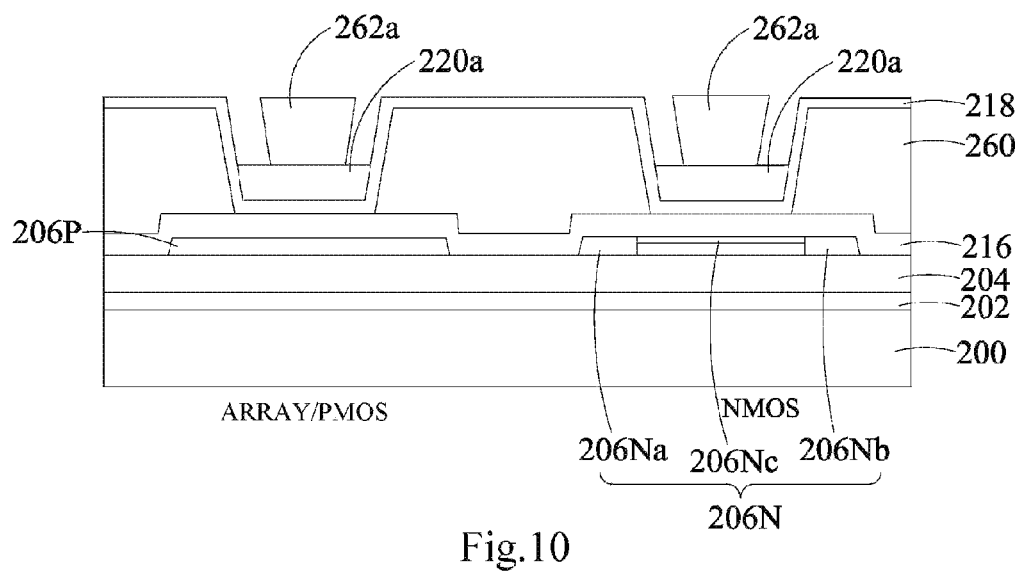

Referring to FIG. 10, using the photoresist pattern 262a as a mask, a part of the gate metal layer 220 is selectively removed by wet etching so as to form a gate metal pattern 220a. An exposed upper surface of the gate metal pattern 220a is substantially flush with an upper surface of the gate metal pattern 220a below the photoresist pattern 262a.

Figure 11:
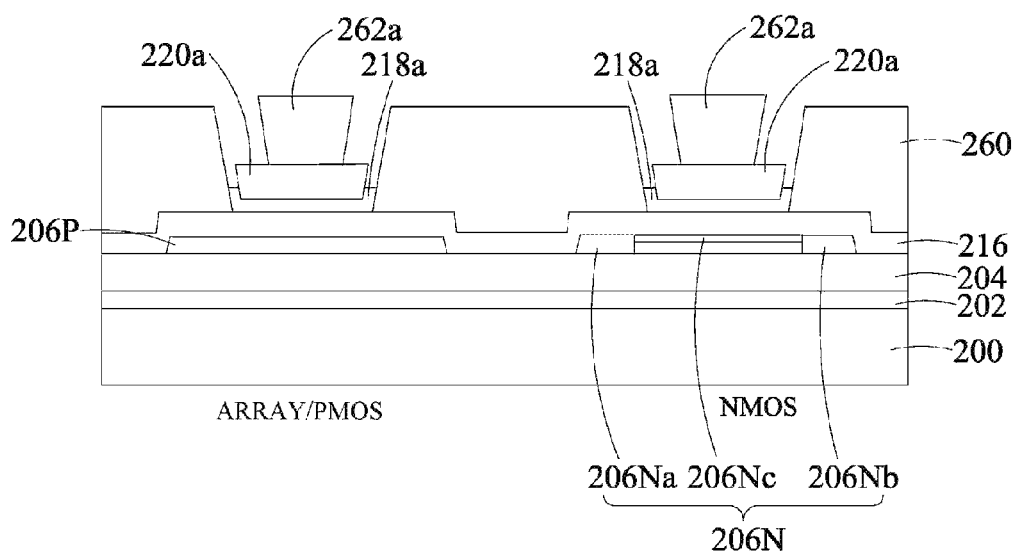

Referring to FIG. 11, a part of the second gate insulating layer 218 is selectively removed by wet etching to form a second gate insulating layer foot 218a. An exposed upper surface of the second gate insulating layer foot 218a is higher than an upper surface of the second gate insulating layer foot 218a below the gate metal pattern 220a. That is, an edge of the second gate insulating layer foot 218a has a protrusion.

Figure 12:
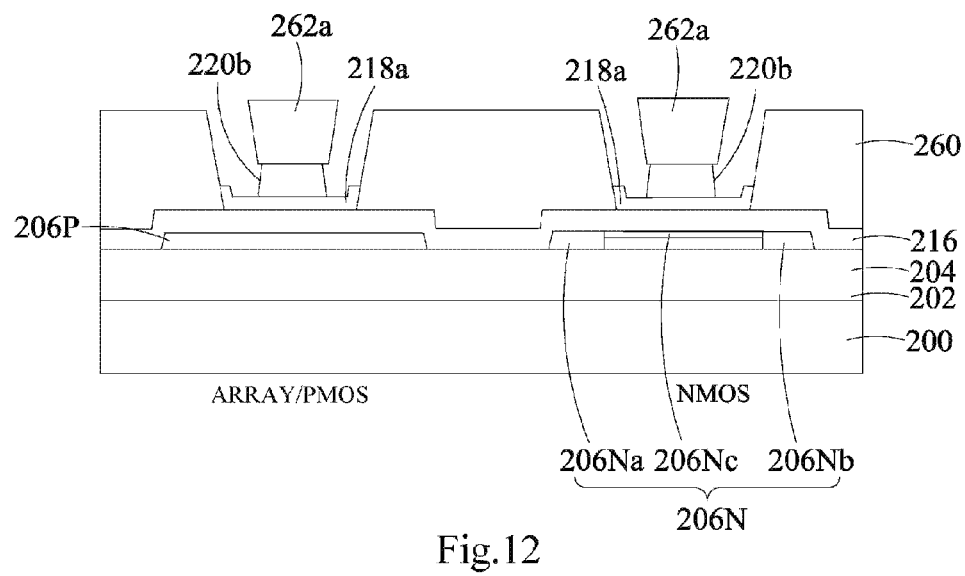

Referring to FIG. 12, using the photoresist pattern 262a as a mask, a secondary etching is performed on the gate metal pattern 220a by wet etching to obtain a gate electrode 220b. A width of the gate electrode 220b corresponds to a width of a channel region. A semiconductor region below the gate electrode 220b is the channel region.

Figure 13:
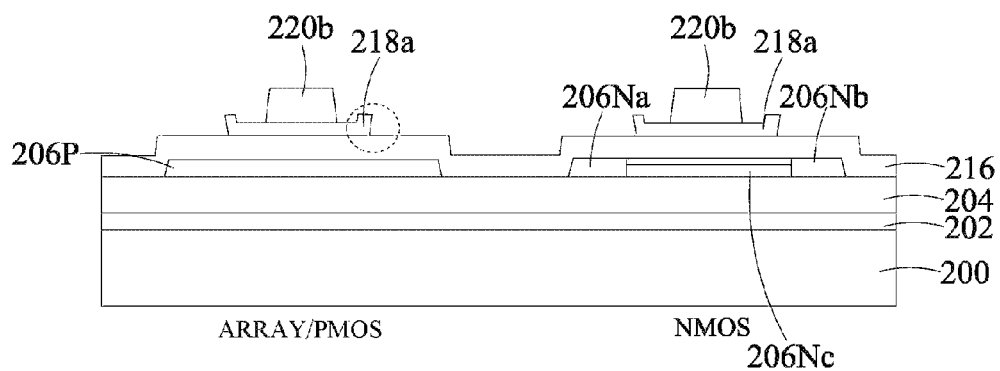

Then, the photoresist pattern 260 and the photoresist pattern 262a are peeled off, obtaining a structure having no first gate insulating layer loss, as shown in FIG. 13. Referring to the part as indicated by the circle in FIG. 13, there is no silicon oxide loss.

Figure 14:
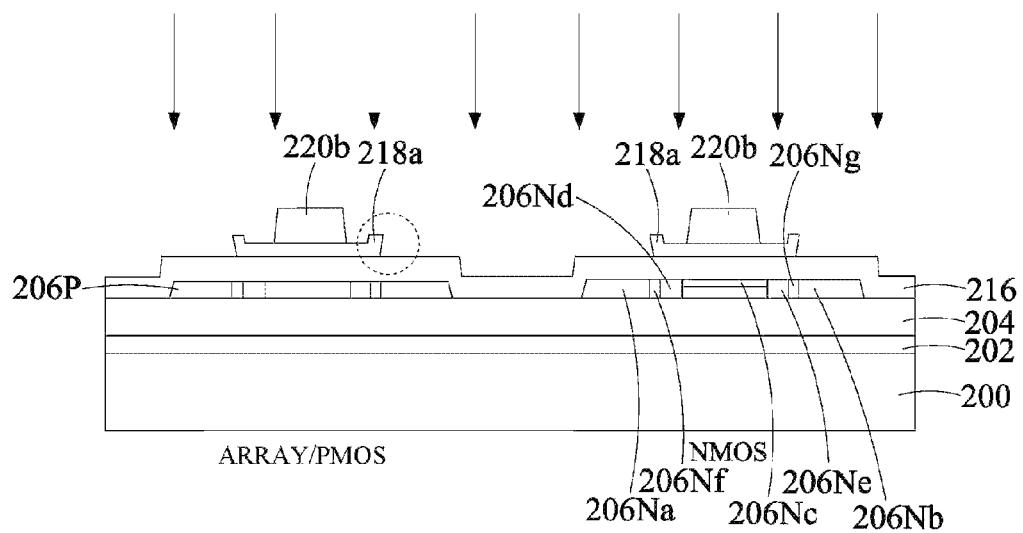

Next, referring to FIG. 14, using the gate structure including the gate electrode 220b and the silicon nitride foot 218a as a mask, self-alignment N-doping is performed on the semiconductor layer of the NMOS using dopant such as P or As so as to obtain first LDD regions 206Nd and 206Ne of the NMOS TFT. The first LDD regions 206Nd and 206Ne are adjacent to the channel region. Meanwhile, second LDD regions 206Nf and 206Ng having a doping concentration lower than that of the first LDD regions 206Nd and 206Ne may be obtained. The second LDD regions 206Nf and 206Ng are adjacent to the first LDD regions 206Nd and 206Ne so as to form series LDD regions.

Figure 15:
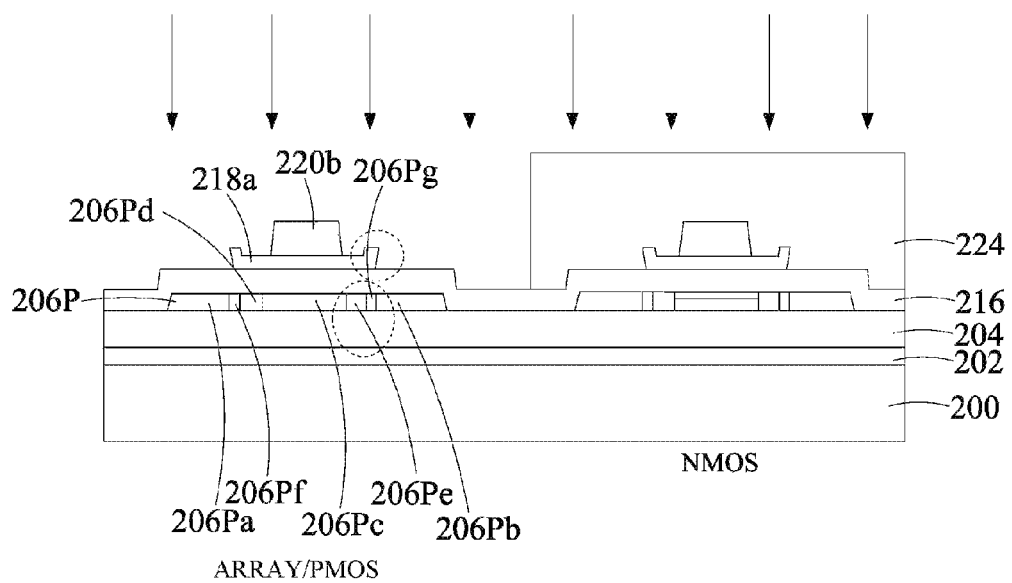

Next, referring to FIG. 15, a photoresist is formed on a resulted structure and patterning is performed to form a photoresist pattern 224. The photoresist pattern 224 exposes a PMOS region and covers the NMOS region. Using the gate structure including the gate electrode 220b and the silicon nitride foot 218a as a mask, P type dopant such as $BF_3$ is injected into the semiconductor layer of the PMOS TFT by ion implantation, so as to form a source region 206Pa and a drain region 206Pb of the PMOS TFT. Because of the structure of the silicon nitride foot, P type LDD regions 206Pd and 206Pe and second LDD regions 206Pf and 206Pg (the second LDD regions 206Pf and 206Pg having a doping concentration lower than that of the first LDD regions 206Pd and 206Pe) may be formed in a self-alignment manner in this process. The first LDD regions 206Pd and 206Pe are adjacent to the second LDD regions 206Pf and 206Pg so as to form series LDD regions. A semiconductor region below the gate electrode 220b is the channel region.

Next, subsequent processes may be performed on a resulted structure. The subsequent processes are similar to conventional processes, and their detailed descriptions are omitted herein. For example, interlayer dielectric layers are formed on a resulted structure. An etching masking pattern is formed on the interlayer dielectric layers. Contact holes exposing the source region and the drain region of the TFT are formed by etching. A data line layer is deposited on a resulted structure and the contact holes are filled. A data wiring including a source electrode/drain electrode is formed by patterning. The source electrode/drain electrode is electrically connected with the source region/drain region of the TFT via the contact holes. Then, a process for forming a passivation layer covering the data wiring and other subsequent processes may be performed.

According to exemplary implementations, when the SiN is etched as having a protrusion at its edge, series LDDs may be formed in the active layer by ion implantation process. The series LDDs may further reduce Ioff (off current) of the TFT.

According to the exemplary implementations, in the AMOLED array substrate including TFTs manufactured by employing the method according to the present disclosure, the leakage current in a switching transistor may be reduced, thereby avoiding instability and even failure in the operation of the assembly caused by overlarge leakage current. Furthermore, since better uniformity of TFT may be obtained, image quality of a display may be increased. It shall be appreciated that the technical solutions according to the present disclosure may also be applied in next generation of displays such as LTPS-LCD, etc.

The exemplary implementations of the present disclosure are shown and described above in detail. It shall be appreciated that the present disclosure is not limited to the disclosed implementations, and instead, the present disclosure intends to encompass various modifications and equivalent arrangements within the spirit and scope of the appended claims.

What is claimed is:

1. A thin film transistor, comprising:
    a semiconductor layer having a source region, a drain region, a channel region, first lightly doped drain regions adjacent to the channel region and second lightly drain regions adjacent to the first lightly doped drain regions;
    wherein one of the second lightly doped drain regions is adjacent to the source region, and the other of the second lightly doped drain regions is adjacent to the drain region; and
    the second lightly doped drain regions have a doping concentration lower than that of the first lightly doped drain regions;
    the thin film transistor further comprises:
    a substrate:
    a buffer layer on the substrate, the semiconductor layer being on the buffer layer;
    a first gate insulating layer covering the semiconductor layer;
    a second gate insulating layer foot on the first gate insulating layer, the second gate insulating layer foot having a width smaller that that of the first gate insulating layer, and
    a gate electrode on the second gate insulating later foot:
    wherein an edge of the second gate insulating layer foot has a protrusion, such that a thickness of the edge is larger that that of other part of the second gate insulating layer foot.

2. The thin film transistor according to claim 1, wherein the gate electrode is formed of at least one material selected from a group consisting of molybdenum, aluminum, an alloy of aluminum and nickel, an alloy of molybdenum and tungsten, chromium, and copper.

3. The thin film transistor according to claim wherein a width of the gate electrode is smaller than that of t he second gate insulating layer foot.

4. An active matrix organic light emitting diode assembly, comprising a thin film transistor, wherein the thin film transistor comprises:
    a semiconductor layer having a source region, a drain region, a channel region, first lightly doped drain regions adjacent to t he channel region and second lightly doped drain regions adjacent to the first lightly doped drain regions;
    wherein one of the second lightly doped drain regions is adjacent to the source region, and the other of the second lightly doped drain regions is adjacent to the drain region; and
    the second lightly doped drain regions have a doping concentration lower than that of the first lightly doped drain regions;
    wherein the thin film transistor further comprises:
    a substrate:
    a buffer layer on the substrate, the semiconductor layer being on the buffer layer;
    a first gate insulating layer covering the semiconductor layer;
    a second gate insulating layer foot on the first gate insulating layer, the second gate insulating layer foot having a width smaller that that of the first gate insulating layer; and
    a gate electrode on the second gate insulating later foot:
    wherein an edge of the second gate insulating layer foot has a protrusion, such that a thickness of the edge is larger that that of other part of the second gate insulating layer foot.

5. The active matrix organic light emitting diode assembly according to claim 4, wherein the gate electrode is formed of at least one material selected from a group consisting of molybdenum, aluminum, an alloy of aluminum and nickel, an alloy of molybdenum and tungsten, chromium, and copper.

6. The active matrix organic light emitting diode assembly according to claim 4, wherein a width of the gate electrode is smaller than that of the second gate insulating layer foot.

* * * * *